United States Patent
Yoshida et al.

(10) Patent No.: US 11,600,502 B2
(45) Date of Patent: Mar. 7, 2023

(54) SUBSTRATE LIQUID PROCESSING APPARATUS, SUBSTRATE LIQUID PROCESSING METHOD AND RECORDING MEDIUM

(71) Applicant: Tokyo Electron Limited, Tokyo (JP)

(72) Inventors: Hiroshi Yoshida, Koshi (JP); Yuki Ishii, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 51 days.

(21) Appl. No.: 16/546,653

(22) Filed: Aug. 21, 2019

(65) Prior Publication Data
US 2020/0066553 A1    Feb. 27, 2020

(30) Foreign Application Priority Data
Aug. 23, 2018  (JP) .............................. JP2018-156171

(51) Int. Cl.
*H01L 21/67* (2006.01)
*H01L 21/306* (2006.01)
*H01L 21/66* (2006.01)

(52) U.S. Cl.
CPC .. *H01L 21/67086* (2013.01); *H01L 21/30604* (2013.01); *H01L 21/67253* (2013.01); *H01L 22/26* (2013.01)

(58) Field of Classification Search
None
See application file for complete search history.

(56) References Cited

U.S. PATENT DOCUMENTS

| | | | | |
|---|---|---|---|---|
| 5,722,441 A | * | 3/1998 | Teramoto | B08B 3/10 257/E21.228 |
| 5,845,660 A | * | 12/1998 | Shindo | H01L 21/67028 134/56 R |
| 5,887,602 A | * | 3/1999 | Iwama | H01L 21/67057 134/43 |

(Continued)

FOREIGN PATENT DOCUMENTS

| | | |
|---|---|---|
| JP | H10-154682 A | 6/1998 |
| JP | H11-067707 A | 3/1999 |

(Continued)

*Primary Examiner* — Sylvia Macarthur
(74) *Attorney, Agent, or Firm* — Pearne & Gordon LLP (57) ABSTRACT

A substrate liquid processing apparatus includes a processing tub configured to store a processing liquid therein; a processing liquid supply configured to supply the processing liquid into the processing tub; a processing liquid drain device configured to drain the processing liquid from the processing tub; and a controller configured to control the processing liquid supply and the processing liquid drain device. The controller calculates, in response to an instruction to change a concentration of a preset component of the processing liquid stored in the processing tub, a drain amount and a feed amount of the processing liquid from/into the processing tub based on information upon a current concentration of the preset component, information upon a concentration increment thereof per unit time and information upon the changed concentration thereof, and controls the processing liquid supply and the processing liquid drain device based on the calculation result.

4 Claims, 6 Drawing Sheets

(56) References Cited

U.S. PATENT DOCUMENTS

| | | | |
|---|---|---|---|
| 6,749,716 B2* | 6/2004 | Ottow | H01L 21/31111 134/113 |
| 8,287,751 B1* | 10/2012 | Hebert | H01L 21/02052 216/88 |
| 8,652,344 B2* | 2/2014 | Tsurusaki | H01L 21/6708 216/83 |
| 9,881,799 B2* | 1/2018 | Sato | H01L 21/67253 |
| 2002/0164414 A1* | 11/2002 | Okubo | G03F 7/3057 427/8 |
| 2015/0131403 A1* | 5/2015 | Takaki | G05D 11/138 366/137 |
| 2016/0042981 A1* | 2/2016 | Sato | H01L 21/67086 134/18 |
| 2016/0184859 A1* | 6/2016 | Kamimura | H01L 21/67086 216/84 |
| 2016/0225683 A1* | 8/2016 | Sato | H01L 21/67086 |
| 2017/0229323 A1* | 8/2017 | Watanabe | B24B 57/02 |
| 2018/0233384 A1* | 8/2018 | Nagai | H01L 21/67248 |
| 2018/0247839 A1* | 8/2018 | Kurasaki | H01L 21/67248 |
| 2020/0066553 A1* | 2/2020 | Yoshida | H01L 21/67028 |

FOREIGN PATENT DOCUMENTS

| | | |
|---|---|---|
| JP | 5448521 B2 * | 3/2014 |
| JP | 2016-143684 A | 8/2016 |
| JP | 2018-060896 A | 4/2018 |

* cited by examiner

SUBSTRATE LIQUID PROCESSING APPARATUS, SUBSTRATE LIQUID PROCESSING METHOD AND RECORDING MEDIUM

CROSS-REFERENCE TO RELATED APPLICATION

This application claims the benefit of Japanese Patent Application No. 2018-156171 filed on Aug. 23, 2018, the entire disclosure of which is incorporated herein by reference.

TECHNICAL FIELD

The various aspects and embodiments described herein pertain generally to a substrate liquid processing apparatus, a substrate liquid processing method and a recording medium.

BACKGROUND

Patent Document 1 describes a substrate liquid processing apparatus configured to circulate a processing liquid for processing a substrate in a processing liquid circulator and measure, with a concentration sensor, a concentration of the processing liquid discharged from a processing liquid drain device which is branched from the processing liquid circulator.

Patent Document 1: Japanese Patent Laid-open Publication No. 2016-143684

SUMMARY

In one exemplary embodiment, a substrate liquid processing apparatus includes a processing tub configured to store a processing liquid therein; a processing liquid supply configured to supply the processing liquid into the processing tub; a processing liquid drain device configured to drain the processing liquid from the processing tub; and a controller configured to control the processing liquid supply and the processing liquid drain device. The controller calculates, in response to an instruction to change a concentration of a preset component of the processing liquid stored in the processing tub, a drain amount of the processing liquid from the processing tub and a feed amount of the processing liquid into the processing tub based on information upon a current concentration of the preset component, information upon a concentration increment of the preset component of the processing liquid in the processing tub per unit time and information upon the concentration of the preset component after being changed in response to the instruction, and controls the processing liquid supply and the processing liquid drain device based on a calculation result.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be describe in detail with reference to the accompanying drawings. Further, in the various drawings, same or corresponding parts will be assigned same reference numerals.

[Substrate Liquid Processing System]

Figure 1:
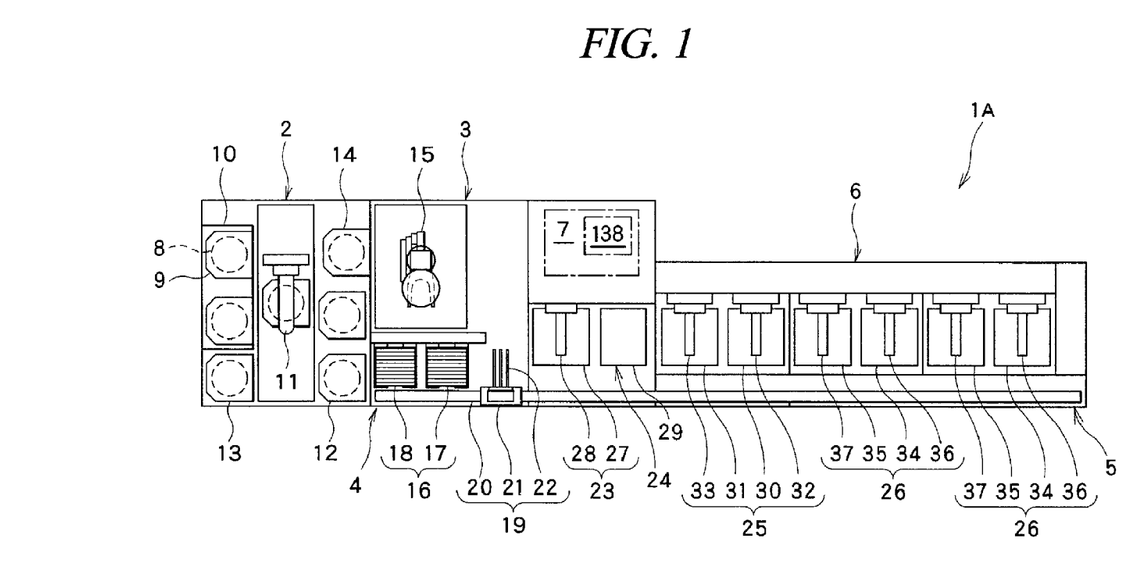
FIG. 1 is a plan view schematically illustrating a substrate liquid processing system according to an exemplary embodiment.

As depicted in FIG. 1, the substrate liquid processing system 1A includes a carrier carry-in/out unit 2; a lot forming unit 3, a lot placing unit 4, a lot transferring unit 5, a lot processing unit 6 and a controller 7.

The carrier carry-in/out unit 2 is configured to perform a carry-in and a carry-out of a carrier 9 in which a plurality (e.g., 25 sheets) of substrates (silicon wafers) 8 are vertically arranged in a horizontal posture. The carrier carry-in/out unit 2 is equipped with a carrier stage 10 configured to place multiple carriers 9 thereon; a carrier transfer device 11 configured to transfer the carrier 9; carrier stocks 12 and 13 configured to place therein the carrier 9 temporarily; and a carrier placing table 14 configured to place the carrier 9 thereon. Here, the carrier stock 12 temporarily places therein a substrate 8 to be produced as a product before the substrate 8 is processed by the lot processing unit 6. Further, the carrier stock 13 temporarily places therein the substrate 8 to be produced as the product after the substrate 8 is processed by the lot processing unit 6.

The carrier carry-in/out unit 2 transfers the carrier 9, which is carried onto the carrier stage 10 from the outside, to the carrier stock 12 or the carrier placing table 14 by using the carrier transfer device 11. Further, the carrier carry-in/out unit 2 transfers the carrier 9, which is placed on the carrier placing table 14, to the carrier stock 13 or the carrier stage 10 by using the carrier transfer device 11. The carrier 9 transferred to the carrier stage 10 is carried to the outside.

The lot forming unit 3 is configured to form a lot composed of a multiple number (e.g., 50 sheets) of substrates 8 to be processed at the same time. These multiple number of substrates 8 are prepared by combining substrates 8 accommodated in one or more carriers 9. Further, when forming the lot, the substrates 8 may be arranged such that their surfaces having patterns formed thereon face each other or such that their surfaces having the patterns formed thereon all face to one direction. The lot forming unit 3 is equipped with a substrate transfer device 15 configured to transfer a plurality of substrates 8. Further, the substrate transfer device 15 is capable of changing a posture of the substrates 8 from a horizontal posture to a vertical posture and from the vertical posture to the horizontal posture while transferring the substrates 8.

In the lot forming unit 3, the substrates 8 are transferred into the lot placing unit 4 from the carrier 9 placed on the carrier placing table 14 by using the substrate transfer device 15, and the substrates 8 forming the lot are placed in the lot placing unit 4. Further, in the lot forming unit 3, the lot placed in the lot placing unit 4 is transferred into the carrier 9 placed on the carrier placing table 14 by the substrate transfer device 15. Further, the substrate transfer device 15 is equipped with, as a substrate support configured to support the plurality of substrates 8, two types of the substrate supports, that is, a before-processed substrate support configured to support the substrates 8 before being subjected to a processing (that is, before being transferred by the lot transferring unit 5); and an after-processed substrate support configured to support the processed substrates 8 (after being transferred by the lot transferring unit 5). Accordingly, particles or the like adhering to the substrates 8 before being processed may be suppressed from adhering to the substrates 8 after being processed.

In the lot placing unit 4, the lot transferred between the lot forming unit 3 and the lot processing unit 6 by the lot transferring unit 5 is temporarily placed (stands by) on the lot placing table 16. The lot placing unit 4 is equipped with a carry-in side lot placing table 17 configured to place thereon the lot before being processed (before being transferred by the lot transferring unit 5); and a carry-out side lot placing table 18 configured to place thereon the lot after being processed (after being transferred by the lot transferring unit 5). On each of the carry-in side lot placing table 17 and the carry-out side lot placing table 18, the multiple number of substrates 8 corresponding to the single lot are arranged in a forward-backward direction with the vertical posture.

In the lot placing unit 4, the lot formed in the lot forming unit 3 is placed on the carry-in side lot placing table 17, and this lot is carried into the lot processing unit 6 through the lot transferring unit 5. Further, in the lot placing unit 4, the lot carried out of the lot processing unit 6 through the lot transferring unit 5 is placed on the carry-out side lot placing table 18, and this lot is transferred into the lot forming unit 3.

The lot transferring unit 5 is configured to transfer the lot between the lot placing unit 4 and the lot processing unit 6 and within the lot processing unit 6. The lot transferring unit 5 is equipped with the lot transfer device 19 configured to transfer the lot. The lot transfer device 19 includes a rail 20 extending along the lot placing unit 4 and the lot processing unit 6; and a moving body 21 configured to be moved along the rail 20 while holding the multiple number of substrates 8. The moving body 21 is provided with a substrate holding body 22 for holding the multiple number of substrates 8 arranged in the forward-backward direction with the vertical posture, and this substrate holding body 22 is configured to be movable forward and backward.

The lot transferring unit 5 receives the lot placed on the carry-in side lot placing table 17 with the substrate holding body 22 of the lot transfer device 19 and delivers the received lot to the lot processing unit 6. Further, the lot transferring unit 5 receives the lot processed by the lot processing unit 6 with the substrate holding body 22 of the lot transfer device 19 and delivers the received lot to the carry-out side lot placing table 18. Further, the lot transferring unit 5 also performs the transfer of the lot within the lot processing unit 6 by using the lot transfer device 19.

The lot processing unit 6 is configured to perform a processing such as etching, cleaning or drying on the single lot composed of the substrates 8 arranged in the forward-backward direction with the vertical posture. The lot processing unit 6 includes a drying apparatus 23 configured to perform a drying processing on the substrates 8; a substrate holding body cleaning apparatus 24 configured to perform a cleaning processing on the substrate holding body 22; a cleaning apparatus 25 configured to perform a cleaning processing on the substrates 8; and two etching apparatuses 26 configured to perform an etching processing on the substrates 8.

The drying apparatus 23 is equipped with a processing tub 27; and a substrate elevating device 28 provided at the processing tub 27 and configured to be movable up and down. A processing gas for drying such as IPA (isopropyl alcohol) or the like is supplied to the processing tub 27. The substrate elevating device 28 holds the substrates 8 corresponding to the single lot while keeping the substrates 8 arranged in the forward-backward direction with the vertical posture. The drying apparatus 23 receives the lot from the substrate holding body 22 of the lot transfer device 19 with the substrate elevating device 28, and moves the received lot up and down with the substrate elevating device 28, so that a drying processing of the substrates 8 is performed with the processing gas for drying supplied into the processing tub 27. Further, the drying apparatus 23 delivers the lot to the substrate holding body 22 of the lot transfer device 19 from the substrate elevating device 28.

The substrate holding body cleaning apparatus 24 includes a processing tub 29 and is configured to supply a processing liquid for cleaning and a drying gas into this processing tub 29. By supplying the drying gas after supplying the processing liquid for cleaning to the substrate holding body 22 of the lot transfer device 19, a cleaning processing on the substrate holding body 22 is performed.

The cleaning apparatus 25 has a processing tub 30 for cleaning and a processing tub 31 for rinsing. The processing tub 30 for cleaning is equipped with a substrate elevating device 32 configured to be vertically movable, and the processing tub 31 for rinsing is equipped with a substrate elevating device 33 configured to be vertically movable. The processing tub 30 for cleaning stores therein a processing liquid for cleaning (SC-1 or the like). The processing tub 31 for rinsing stores therein a processing liquid for rinsing (pure water or the like).

The etching apparatus 26 has a processing tub 34 for etching and a processing tub 35 for rinsing. The processing tub 34 and the processing tub 35 are equipped with a substrate elevating device 36 and a substrate elevating device 37 configured to be vertically movable, respectively. The processing tub 34 for etching stores therein a processing liquid for etching (a phosphoric acid aqueous solution). The processing tub 35 for rinsing stores therein a processing liquid for rinsing (pure water or the like).

The cleaning apparatus 25 and the etching apparatus 26 have the same configuration. The etching apparatus 26 will be described. The multiple number of substrates 8 constituting the single lot are held by the substrate elevating device 36 while being arranged in the forward-backward direction with the vertical posture. In the etching apparatus 26, the substrate elevating device 36 receives the lot from the substrate holding body 22 of the lot transfer device 19, and the received lot is moved up and down by the substrate elevating device 36. Accordingly, the lot is immersed in the processing liquid for etching in the processing tub 34, so that an etching processing is performed on the substrates 8. Thereafter, the etching apparatus 26 delivers the lot to the substrate holding body 22 of the lot transfer device 19 from the substrate elevating device 36. Then, the lot is received by the substrate elevating device 37 from the substrate holding body 22 of the lot transfer device 19, and the received lot is moved up and down by the substrate elevating device 37. Accordingly, the lot is immersed in the processing liquid for rinsing in the processing tub 35, so that a rinsing processing is performed on the substrates 8. Thereafter, the lot is delivered to the substrate holding body 22 of the lot transfer device 19 from the substrate elevating device 37.

The controller 7 controls operations of individual components (the carrier carry-in/out unit 2, the lot forming unit 3, the lot placing unit 4, the lot transferring unit 5, the lot processing unit 6) of the substrate liquid processing system 1A. The controller 7 may be implemented by, for example, a computer and has a computer-readable recording medium 138. The recording medium 138 stores therein programs for controlling various types of processings performed in the substrate liquid processing system 1A. The controller 7 controls the operation of the substrate liquid processing system 1A by reading and executing the programs stored in the recording medium 138. Further, the programs are stored in the compute-readable recording medium 138 and may be installed to the recording medium 138 of the controller 7 from another recording medium. The computer-readable recording medium 138 may be, by way of example, a hard disk HD, a flexible disk FD, a compact disk CD, a magnet optical disk MO, a memory card, or the like.

[Substrate Liquid Processing Apparatus]

Figure 2:
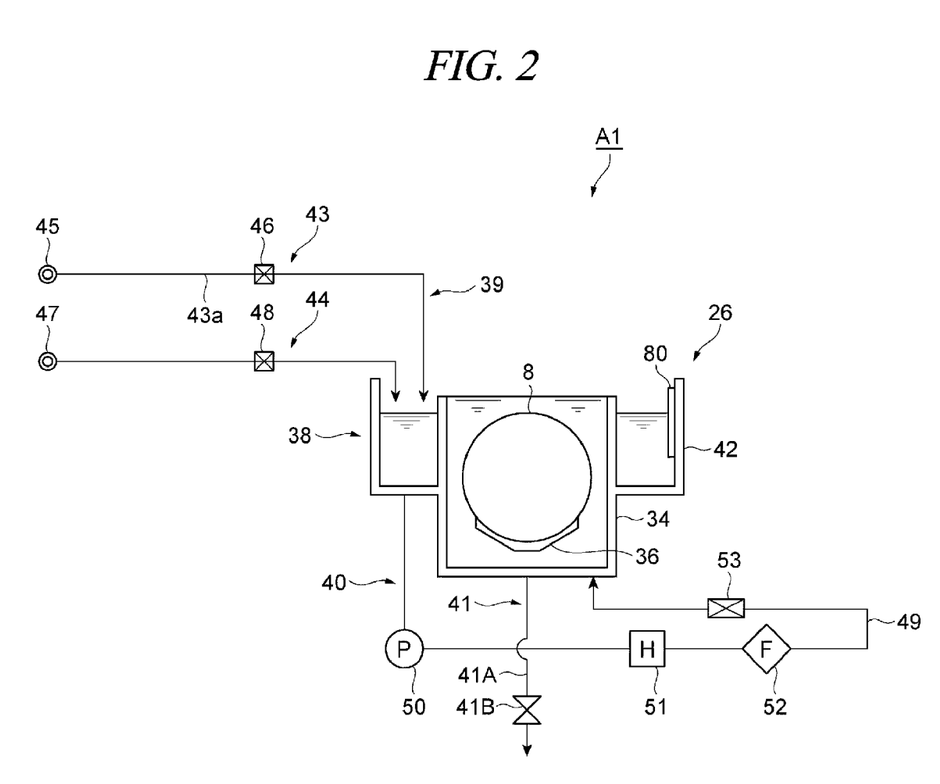
FIG. 2 is a schematic diagram illustrating a substrate liquid processing apparatus according to the exemplary embodiment.

Now, referring to FIG. 2, the substrate liquid processing apparatus A1 belonging to the substrate liquid processing system 1A will be elaborated. As depicted in FIG. 2, the substrate liquid processing apparatus A1 includes the etching apparatus 26.

The etching apparatus 26 is configured to perform a liquid processing (etching processing) on the substrate 8 by using an aqueous solution of a chemical (phosphoric acid) having a preset concentration (for example, 88.3 wt % of phosphoric acid aqueous solution) as a processing liquid for the etching. Here, the aforementioned "88.3 wt %" is an example of the concentration of the phosphoric acid aqueous solution when a concentration of the processing liquid is adjusted to a predetermined concentration, and the concentration of the phosphoric acid aqueous solution may be appropriately adjusted. The etching apparatus 26 is equipped with, as shown in FIG. 2, a processing liquid storage 38, a processing liquid supply 39, a processing liquid circulator 40 and a processing liquid drain device 41.

The processing liquid storage 38 is configured to store therein the processing liquid, and the substrate 8 is processed by this processing liquid. The processing liquid storage 38 includes a processing tub 34 and an outer tub 42. Within the processing liquid storage 38, the outer tub 42 having an open top is provided around an upper portion of the processing tub 34 having an open top, and the processing liquid is stored in the processing tub 34 and the outer tub 42. The processing tub 34 is configured to store therein the processing liquid in which the substrate 8 is immersed by the substrate elevating device 36 to be processed. The outer tub 42 is configured to store therein the processing liquid overflowing from the processing tub 34. The processing liquid stored in the outer tub 42 is supplied into the processing tub 34 by the processing liquid circulator 40. The outer tub 42 is provided with a liquid surface sensor 80. The liquid surface sensor 80 is a sensor configured to detect a height of a liquid surface within the outer tub 42 of the processing liquid storage 38. Various kinds of sensors capable of detecting the liquid surface height can be used as the liquid surface sensor 80. The liquid surface sensor 80 is configured to output information indicating the detected liquid surface height to the controller 7.

The processing liquid supply 39 is configured to supply the processing liquid into the processing liquid storage 38. The processing liquid supply 39 includes an aqueous solution supply 43 and a water supply 44 (pure water supply). The aqueous solution supply 43 is equipped with an aqueous solution supply source 45 and a flow rate controller 46.

The aqueous solution supply source 45 is configured to supply the phosphoric acid aqueous solution into the processing liquid storage 38. By way of non-limiting example, the aqueous solution supply source 45 supplies 88.3 weight % of phosphoric acid aqueous solution having a temperature of 25° C. The phosphoric acid aqueous solution supplied from the phosphoric acid supply source 45 is introduced into the processing liquid storage 38 via a flow path 43a. The flow rate controller 46 is provided downstream of the aqueous solution supply source 45 at the flow path 43a. The flow rate controller 46 is connected to the controller 7, and an opening/closing operation and a flow rate of the flow rate controller 46 are controlled by the controller 7.

The water supply 44 is configured to supply water (pure water) into the processing liquid storage 38. The water supply 44 includes a water supply source 47 for supplying the pure water of a preset temperature (for example, 25° C.), and the water supply source 47 is connected to the outer tub 42 of the processing liquid storage 38 via a flow rate controller 48. The flow rate controller 48 is connected to the controller 7, and an opening/closing operation and a flow rate of the flow rate controller 48 are controlled by the controller 7.

The processing liquid circulator 40 is configured to send the processing liquid within the outer tub 42 into the processing tub 34. The processing liquid circulator 40 includes a circulation path 49, a pump 50, a heater 51, a filter 52 and a silicon concentration meter 53 (concentration measuring device). The circulation path 49 is a flow path extending from a bottom of the outer tub 42 of the processing liquid storage 38 to a bottom of the processing tub 34. The circulation path 49 is equipped with the pump 50, the heater 51, the filter 52 and the silicon concentration meter 53 which are provided in sequence from an upstream side (outer tub 42 side) toward a downstream side (processing tub 34 side). The pump 50 and the heater 51 are connected to and driven by the controller 7. The pump 50 is configured to force-feed the processing liquid from the upstream side toward the downstream side. The heater 51 is configured to heat the processing liquid to a set temperature (e.g., 165° C.). The filter 52 is configured to remove particles mixed in the processing liquid. The silicon concentration meter 53 is configured to measure a silicon concentration of the processing liquid in the circulation path 49. The silicon concentration meter 53 outputs the measured silicon concentration to the controller 7. Further, since the silicon concentration meter 53 is provided at the circulation path 49 of the processing liquid circulator 40 through which the processing liquid in the processing liquid storage 38 is circulated, the silicon concentration meter 53 actually measures the silicon concentration of the processing liquid in the processing liquid storage 38.

The processing liquid drain device 41 is configured to drain the processing liquid from the processing tub 34. The processing liquid drain device 41 has, for example, a drain path 41A and a valve 41B. The processing liquid within the processing tub 34 is drained through the drain path 41A. One end of the drain path 41A is connected to the bottom of the processing tub 34, and the other end of the drain path 41A is connected to a liquid drain pipe (not shown) of the substrate liquid processing system 1A. The valve 41B is provided at the drain path 41A. The valve 41B is connected to the controller 7, and an opening/closing operation thereof is controlled by the controller 7.

Figure 3:
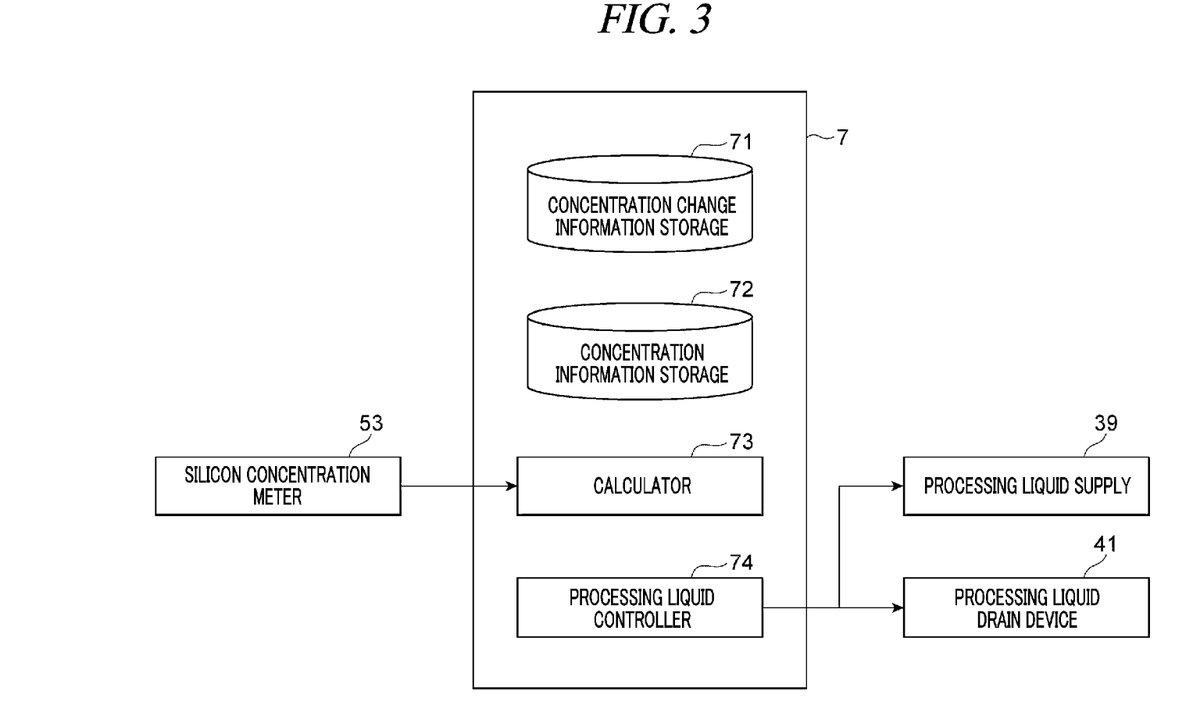
FIG. 3 is a block diagram illustrating functional components of a controller of the substrate liquid processing apparatus according to the exemplary embodiment.

Now, the controller 7 of the etching apparatus 26 will be described in detail with reference to FIG. 3. FIG. 3 is a block diagram illustrating functional components of the controller 7. As depicted in FIG. 3, the controller 7 includes, as the functional components (functional modules), a concentration change information storage 71, a concentration information storage 72, a calculator 73 and a processing liquid controller 74. FIG. 3 illustrates the configuration of the controller 7 for controlling the processing liquid supply 39 and the processing liquid drain device 41 in order to control the silicon concentration in the processing liquid. Thus, though illustration of a configuration for controlling the phosphoric acid concentration or the like is omitted in FIG. 3, a part of the functional components shown in FIG. 3 may have such a function as well.

The concentration change information storage 71 of the controller 7 has a function of storing therein information upon an instruction regarding the silicon concentration of the processing liquid in the processing liquid storage 38 (hereinafter, sometimes simply referred to as "concentration instruction information"). Here, the instruction regarding the silicon concentration refers to information instructing that the silicon concentration of the processing liquid stored in the processing liquid storage 38 in a specific time band needs to be regulated to a preset concentration (range). Details thereof will be described later.

The concentration information storage 72 has a function of storing information required for the controller 7 to control the processing liquid supply 39 and the processing liquid drain device 41 to change the silicon concentration of the processing liquid in the processing liquid storage 38 based on the concentration instruction information. The information regarding the silicon concentration stored in the concentration information storage 72 may include, by way of example, information upon a current silicon concentration of the processing liquid in the processing liquid storage 38, information upon an increment of the silicon concentration of the processing liquid in the processing liquid storage 38 per unit time, and so forth. Details thereof will be described later.

The calculator 73 is configured to calculate a feed amount of the processing liquid into the processing liquid storage 38 by the processing liquid supply 39 (hereinafter, sometimes simply referred to as "feed amount") and a drain amount of the processing liquid from the processing liquid storage 38 by the processing liquid drain device 41 (hereinafter, sometimes simply referred to as "drain amount") based on the instruction upon the change of the silicon concentration stored in the concentration change information storage 71 and the information upon the silicon concentration stored in the concentration information storage 72. Here, the feed amount is an amount of the processing liquid supplied per unit time, and, likewise, the drain amount is an amount of the processing liquid drained per unit time. Furthermore, in case that information upon the silicon concentration of the processing liquid in the processing liquid storage 38 is obtained from the silicon concentration meter 53, the calculator 73 also has a function of correcting the feed amount and the drain amount of the processing liquid by using the corresponding information.

The processing liquid controller 74 controls the processing liquid supply 39 and the processing liquid drain device 41 based on the calculation result of the calculator 73. To be specific, for the processing liquid supply 39, the processing liquid controller 74 performs a control over the processing liquid supplied from the processing liquid supply 39 by controlling the flow rate controllers 46 and 48. Further, for the processing liquid drain device 41, the processing liquid controller 74 performs a control over the processing liquid drained from the processing liquid drain device 41 by controlling the valve 41B.

The above-described individual components of the controller 7 are operated to control the silicon concentration of the processing liquid in the processing liquid storage 38. When it is required to change the silicon concentration of the processing liquid in the processing liquid storage 38, the controller 7 predicts a change of the silicon concentration in a case of changing the feed amount of the processing liquid from the processing liquid supply 39 and the drain amount of the processing liquid from the processing liquid drain device 41. Further, the controller 7 controls the feed amount of the processing liquid from the processing liquid supply 39 and the drain amount of the processing liquid from the processing liquid drain device 41 by using the prediction result. This operation will be elaborated with reference to FIG. 4.

Figure 4:
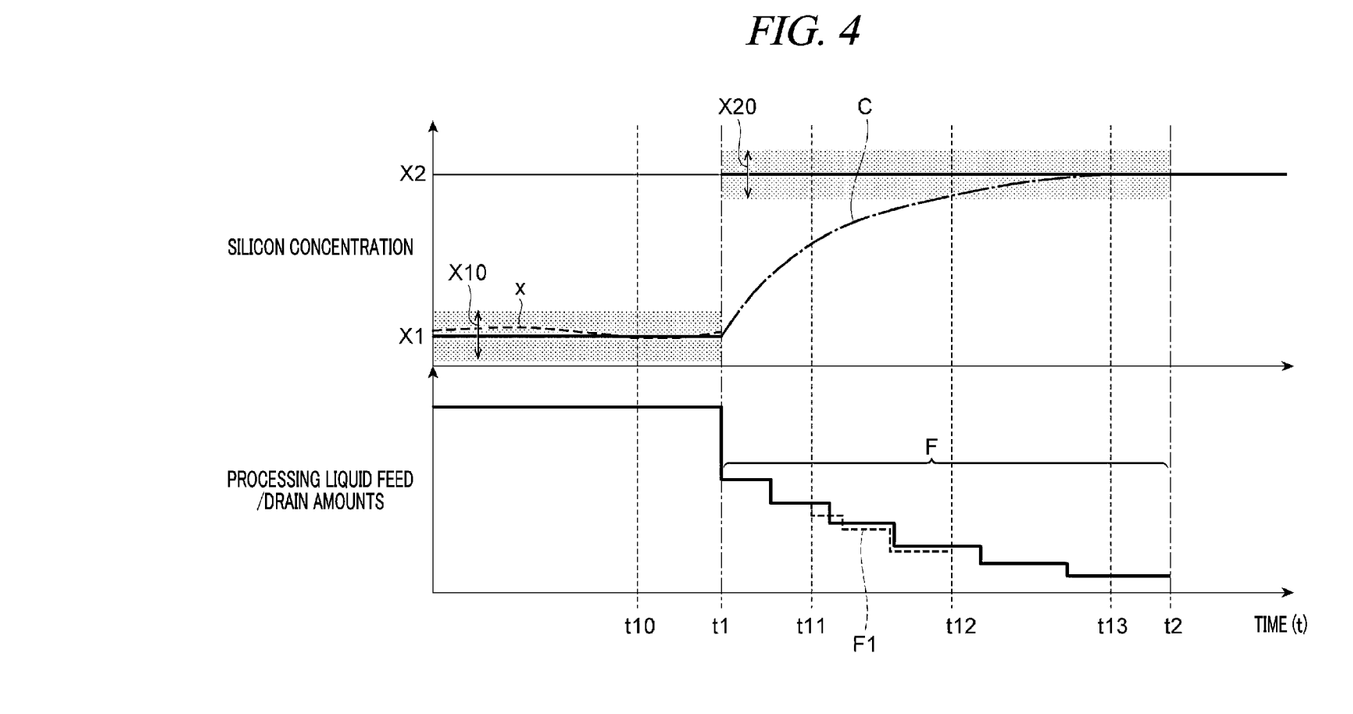
FIG. 4 is a diagram for describing a silicon concentration control in the substrate liquid processing apparatus according to the exemplary embodiment.

FIG. 4 is a diagram illustrating a change in the silicon concentration of the processing liquid within the processing liquid storage 38 with a lapse of a time t. X1 and X2 shown in FIG. 4 denote silicon concentrations designated based on the concentration instruction information. FIG. 4 illustrates a state in which an instruction is made to change the silicon concentration from X1 to X2 at a time t1.

Meanwhile, x in FIG. 4 denotes a dashed line indicating an example of an actual variation of the silicon concentration of the processing liquid in the processing liquid storage 38. The silicon concentration of the processing liquid stored in the processing liquid storage 38 is changed due to silicon eluted from the substrate 8 immersed into the processing liquid storage 38. Further, the silicon concentration is also changed as a result of the supply of the processing liquid from the processing liquid supply 39 and the drain of the processing liquid from the processing liquid drain device 41. For these reasons, the silicon concentration may fluctuate to some degree. In view of this, the controller 7 sets a predetermined concentration range X10 including the concentration X1, and the controller 7 performs a control such that the silicon concentration in the processing liquid falls within the concentration range X10. By way of example, the concentration range X10 may be set to be ±2 ppm with respect to the concentration X1. Likewise, a concentration range X20 is set for the concentration X2.

The controller 7 performs an "integral control" when the silicon concentration of the processing liquid stored in the processing liquid storage 38 is required to be maintained constant. By way of non-limiting example, a PID control may be used as the integral control. The controller 7 controls the processing liquid supply 39 and the processing liquid drain device 41 to reduce the fluctuation of the silicon concentration of the processing liquid in the processing liquid storage 38 by using the integral control, and adjusts the feed amount and the drain amount of the processing liquid to maintain the silicon concentration constant. Meanwhile, when it is required to change the silicon concentration of the processing liquid stored in the processing liquid storage 38, the controller 7 controls the silicon concentration of the processing liquid by also changing the feed amount and the drain amount of the processing liquid.

The substrate liquid processing apparatus A1 is equipped with the silicon concentration meter 53. Since an interval of measurement by the silicon concentration meter 53 is comparatively long, it may take time to change the silicon concentration of the processing liquid in the processing liquid storage 38 if it is attempted to control the feed amount and the drain amount of the processing liquid based on the measurement result of the silicon concentration meter 53. Thus, in the substrate liquid processing apparatus A1, the change in the silicon concentration of the processing liquid in the processing liquid storage 38 is predicted, and the feed amount and the drain amount of the processing liquid are changed based on this prediction.

The control of changing the silicon concentration of the processing liquid in the processing liquid storage 38 will be further explained with reference to FIG. 4. FIG. 4 illustrates the state in which the instruction is made to change the silicon concentration of the processing liquid in the processing liquid storage 38 from X1 to X2 at the time t1. Here, the silicon concentration of the processing liquid in the processing liquid storage 38 is changed depending on the amount of the silicon eluted from the substrate 8, the feed amount of the processing liquid from the processing liquid supply 39 and the drain amount of the processing liquid from the processing liquid drain device 41. Therefore, it may not be possible to change the silicon concentration of the processing liquid in the processing liquid storage 38 from X1 to X2 at once. Thus, the controller 7 creates a set curve C upon a variation of the silicon concentration of the processing liquid in the processing liquid storage 38 when changing the silicon concentration from X1 to X2. In the example shown in FIG. 4, the set curve C regarding the concentration variation indicates that the silicon concentration is gradually changed from X1 to X2 between the time t1 and a time t2. Production of the set curve C depends on a processing capability of the substrate liquid processing apparatus A1. To elaborate, the set curve C may be defined by a capacity of the processing liquid storage 38, a silicon concentration increment (silicon concentration increment per unit time) within the processing tub 34, an upper limit of the feed amount (feed amount per unit time) and an upper limit of the drain amount (drain amount per unit time) of the processing liquid in the substrate liquid processing apparatus A1.

Further, the time t2, that is, a time required to change the silicon concentration from X1 to X2 may be set from a time taken to change the silicon concentration at a maximum speed based on the processing capability of the substrate liquid processing apparatus A1 or the like. Furthermore, the time required to change the silicon concentration from X1 to X2 may be previously set, and the time t2 may be set based on this.

Now, the change in the silicon concentration of the processing liquid in the processing liquid storage 38 based on the aforementioned requirements will be explained. By way of example, a silicon concentration before t−1 minute is set as $A_{t-1}$ (ppm); a silicon concentration increment within the processing tub 34, $\Delta\alpha$ (ppm); and a total amount of the liquid within the processing liquid storage 38 and the processing liquid circulator 40 configured to circulate the liquid of the processing liquid storage 38, V (L). Further, it is assumed that the feed amount and the drain amount of the processing liquid are equal, and this same amount is $\Delta E$ (L). In this case, a silicon concentration $A_t$ (ppm) at t minute can be calculated by an expression (1) as follows. In the following expression (1), $\Delta\alpha$ corresponds to the increment of the silicon concentration per unit time, and $\Delta E$ corresponds to the feed amount and the drain amount of the processing liquid per unit time.

[Expression 1]

$$A_t = \frac{A_{t-1}(V - \Delta E)}{V} + \Delta\alpha \quad (1)$$

As can be seen from the above expression (1), a silicon concentration at a certain time point is decided by a range of variation of the silicon concentration for a preset time (here, one minute), the capacity of the processing liquid storage 38, a silicon concentration increment caused by the elution of the silicon from the substrate 8 within the processing tub 34, the upper limit of the feed amount of processing liquid in the substrate liquid processing apparatus A1, and the drain amount of the processing liquid in the substrate liquid processing apparatus A1. Thus, the controller 7 calculates the set curve C based on these information. Further, the aforementioned expression (1) depicts an example method of calculating the silicon concentration in case of controlling the silicon concentration by using the feed amount and the drain amount of the processing liquid. Thus, the method calculating the silicon concentration may not be limited to using the aforementioned expression. Moreover, an expression for calculating the silicon concentration may be created by combining parameters other than the parameters specified above. By way of example, in the expression (1), the silicon concentration increment is used as information regarding the silicon concentration at the right hand side. However, a silicon elution amount may be used instead of the silicon concentration increment. Here, the silicon elution amount refers to an amount of the silicon eluted from the substrate into the processing liquid. When using the silicon elution amount, the silicon elution amount needs to be added to a numerator at the right hand side.

In addition, by setting the set curve C in the controller 7, the feed amount and the drain amount of the processing liquid (the amount corresponding to E in the expression (1)) are calculated. As a result, as shown in FIG. 4, set values of the feed amount and the drain amount of the processing liquid for changing the concentration of the processing liquid in the processing liquid storage 38 to correspond to the set curve C between the time t1 and the time t2 are calculated. The feed amount and the drain amount of the processing liquid between the time t1 and the time t2 calculated according to the aforementioned sequence are indicated by F in FIG. 4. In the controller 7, the processing liquid supply 39 and the processing liquid drain device 41 are controlled based on this calculation result, and the concentration of the processing liquid in the processing liquid storage 38 is adjusted to be changed according to the set curve C by controlling the feed amount and the drain amount of the processing liquid. The control of the silicon concentration according to the above-described method, that is, the control by the controller 7 including the prediction of the concentration of the processing liquid in the processing liquid storage 38 is referred to as a "prediction control" in the present exemplary embodiment.

Further, the method of acquiring the information upon the silicon concentration increment from the substrate 8 within the processing tub 34 is not particularly limited. For example, the information upon the silicon concentration increment can be obtained by measuring the change in the silicon concentration of the processing liquid by the silicon concentration meter 53 in a state where the substrate 8 is accommodated in the processing tub 34 and the control over the change in the silicon concentration using the supply and the drain of the processing liquid is not actively performed. Furthermore, the information upon the silicon concentration increment may be acquired by using a method of previously conducting an additional analysis before the processing upon the substrate 8 is performed. The information upon the silicon concentration increment is stored in the concentration information storage 72 of the controller 7.

In addition, other information required to set the set curve C, for example, the capacity of the processing liquid storage 38, the upper limit of the feed amount (feed amount per unit time) of the processing liquid in the substrate liquid processing apparatus A1, and the drain amount (drain amount per unit time) are also stored in the concentration information storage 72.

In the above-stated concentration adjusting method, a measurement result of the concentration by the silicon concentration meter 53 is not used. The silicon concentration of the processing liquid in the processing liquid storage 38 may be different from the prediction result of the controller 7 due to, for example, a temperature of the processing liquid, a variation of the elution amount of the silicon, or the like. Thus, if the controller 7 acquires the information upon the silicon concentration of the processing liquid in the processing liquid storage 38 measured by the silicon concentration meter 53, the controller 7 corrects the set values by performing the calculation upon the feed amount and the drain amount of the processing liquid again for allowing the silicon concentration to correspond to the set curve C.

In the example shown in FIG. 4, assume that times t10, t11, t12 and t13 are when the information upon the silicon concentration measured by the silicon concentration meter 53 is acquired. The silicon concentrations measured at the time t11 and the time t12 are the values obtained while changing the silicon concentration through the prediction control. Here, assume that a measurement result of the silicon concentration at the time t11 is different from a silicon concentration at the time t11 predicted by the prediction control. In this case, the controller 7 corrects the feed amount and the drain amount of the processing liquid, which are obtained by the prediction control, based on the silicon concentration information obtained from the silicon concentration meter 53. In FIG. 4, the feed amount and the drain amount after being corrected (correction values between the time t11 and the time t12) are indicted by F1. The controller 7 controls the processing liquid supply 39 and the processing liquid drain device 41 based on the feed amount and the drain amount after being corrected, which are indicated by F1. As stated above, if the information upon the silicon concentration measured by the silicon concentration meter 53 is acquired, the feed amount and the drain amount of the processing liquid for obtaining the silicon concentration corresponding to the set curve C are corrected by using the acquired information. Accordingly, the variation of the silicon concentration of the processing liquid within the processing liquid storage 38 can be controlled while reducing an error from the set curve C.

As described above, the controller 7 performs the control over the silicon concentration by combining the control (integral control) which is performed when maintaining the silicon concentration constant and the control (prediction control) which is performed when changing the silicon concentration up to the preset concentration (for example, the concentration X2), while calculating the silicon concentration of the processing liquid in the processing liquid storage 38 regularly (for example, every single minute). A timing for switching the integral control from/to the prediction control becomes the timing when instructing the change of the silicon concentration of the processing liquid in the processing liquid storage 38 from X1 to X2. In the controller 7, information indicating that the target concentration range (X10, X20) of the silicon concentration is changed is used as the instruction for changing the silicon concentration from X1 to X2. That is, the information upon the change of the target concentration range (X10, X20) of the silicon concentration is used as information as a reference for deciding whether to change the control method for the silicon concentration of the processing liquid. As stated above, in the controller 7, the silicon concentration which is regularly calculated is controlled to fall within the preset concentration range (X10) and, also, to approach the target concentration X1. If, however, the target concentration is changed from X1 to X2, for example, the present concentration range is also changed from X10 to X20. Thus, the silicon concentration of the processing liquid falls out of the changed concentration range X20. In the controller 7, the integral control is performed as long as the silicon concentration obtained by the calculation is included in the preset concentration range. If the silicon concentration obtained by the calculation falls out of the preset concentration range, however, the controller 7 specifies the target concentration based on the target concentration range and performs the control (prediction control) of changing the silicon concentration to approach the target concentration. Here, however, the method of switching the integral control from/to the prediction control in the controller 7 may not be limited to the aforementioned method using the target concentration range but may be modified appropriately.

[Substrate Liquid Processing Method]

Figure 5:
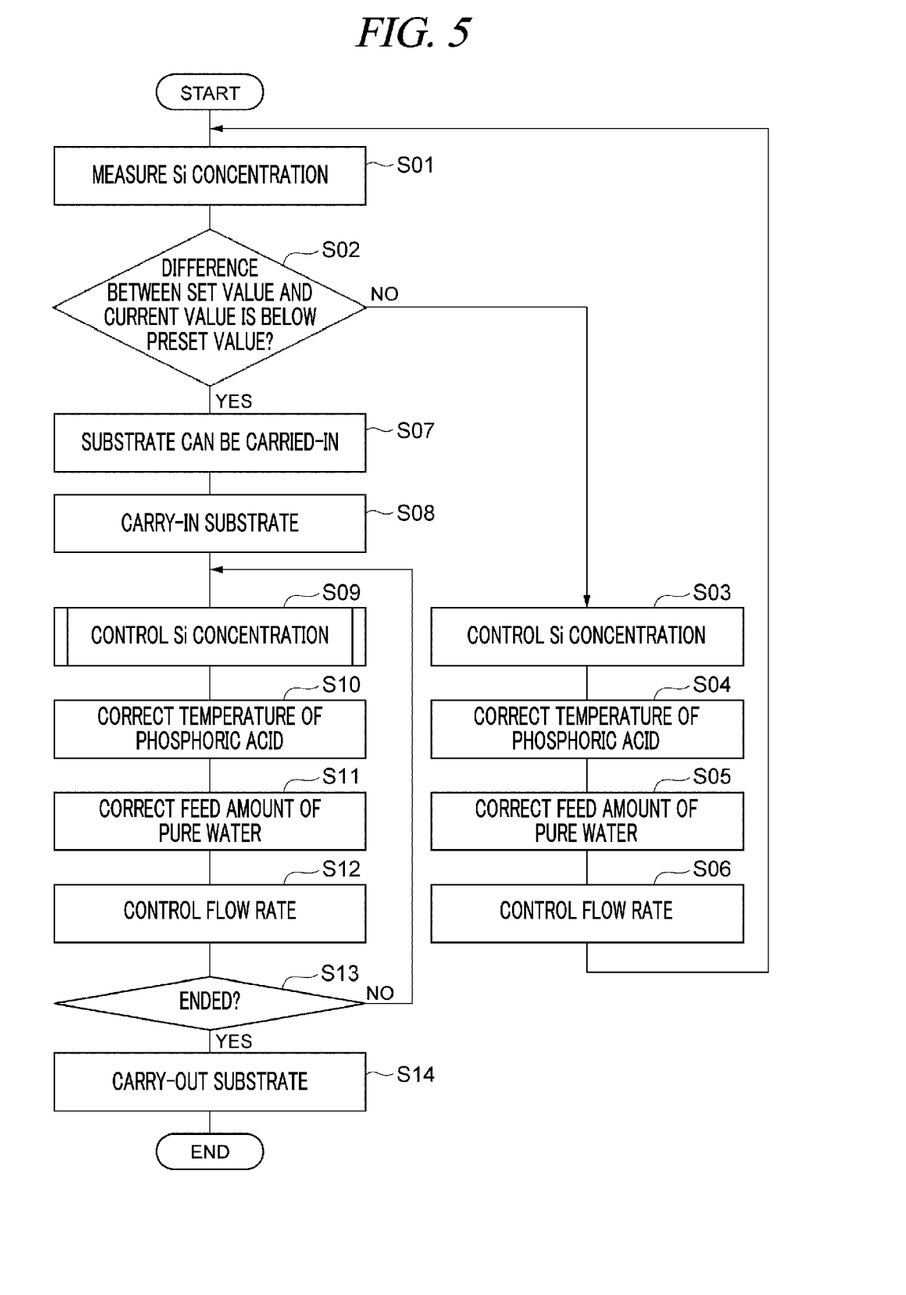
FIG. 5 is a flowchart of a substrate liquid processing method according to the exemplary embodiment.
Figure 6:
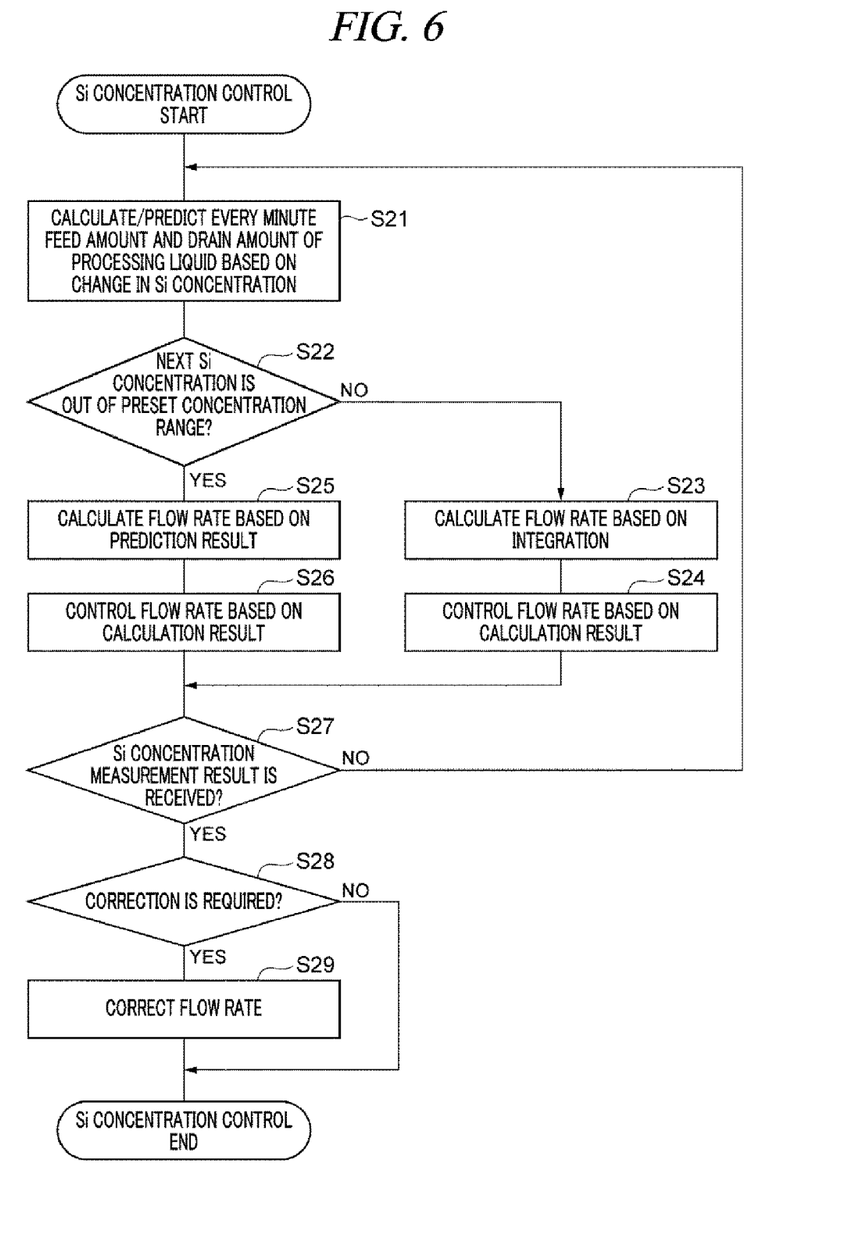
FIG. 6 is a flowchart for describing a silicon concentration control in the substrate liquid processing method according to the exemplary embodiment.

Now, an example of a substrate liquid processing method will be explained with reference to flowcharts of FIG. 5 and FIG. 6. FIG. 5 is a flowchart for describing a sequence of processings performed to carry out a liquid processing upon the substrate in the substrate liquid processing apparatus A1, and FIG. 6 is a flowchart for describing a sequence of a control over a silicon concentration (Si concentration) as one of these processings.

Before the substrate as a target of the liquid processing is carried into the processing liquid storage 38 of the substrate liquid processing apparatus A1, adjustment of the silicon concentration of the processing liquid in the processing liquid storage 38 is performed. First, as depicted in FIG. 5, the silicon concentration (Si concentration) of the processing liquid in the processing liquid storage 38 is measured by using the silicon concentration meter 53 (S01). The measurement result of the silicon concentration is sent to the controller 7. In the calculator 73 of the controller 7, it is checked whether the silicon concentration measured by the silicon concentration meter 53 coincides with a set value for the liquid processing on the substrate (S02). At this time, if a difference between the set value and the current silicon concentration is not below a preset value (S02—NO), that is, if the difference between the set value and the current silicon concentration is equal to or larger than the preset value, the processing liquid controller 74 of the controller 7 controls the processing liquid supply 39 and the processing liquid drain device 41 to adjust the silicon concentration of the processing liquid in the processing liquid storage 38 (S03). In this process, since the substrate 8 is not carried into in the processing tub 34 of the processing liquid storage 38, the adjustment of the silicon concentration is performed by controlling the feed amount and the drain amount of the processing liquid into/from the processing liquid storage 38. Further, in the controller 7, after the correction upon the temperature of the phosphoric acid of the processing liquid in the processing liquid storage 38 (S04) and the correction upon the feed amount of the pure water fed from the water supply 44 (S05) are performed, the feed amount and the drain amount of the processing liquid can be controlled by controlling the processing liquid supply 39 and the processing liquid drain device 41 (S06). Further, in the process (S06) of controlling the feed amount and the drain amount of the processing liquid, a control for adjusting various kinds of parameters regarding the processing liquid in the processing liquid storage 38 (for example, nitrogen bubbling in the processing tub 34) may be performed at the same time.

Meanwhile, if the difference between the set value and the current silicon concentration is less than the preset value (S02—YES), it is determined in the controller 7 that the substrate 8 can be carried into the processing tub 34 (S07), and a control of carrying the substrate 8 into the processing tub 34 is performed (S08). If the substrate 8 is carried into the processing tub 34, a required processing is performed by the processing liquid. At this time, in the controller 7, the control of the silicon concentration is performed by using the aforementioned method, that is, the combination of the integral control and the prediction control (S09: a processing liquid supplying process, a processing liquid drain process and a control process).

A specific sequence of performing the control over the silicon concentration will be explained with reference to FIG. 6. First, if the control of the silicon concentration is begun, the calculator 73 of the controller 7 calculates (predicts) every single minute the feed amount and the drain amount of the processing liquid based on the change in the predetermined silicon concentration (S21). In the calculator 73, the feed amount and the drain amount of the processing liquid are calculated based on the current silicon concentration, the silicon concentration at the next time point (simply referred to as "next silicon concentration"), the elution amount of the silicon concentration from the substrate 8, and so forth.

Subsequently, the processing liquid controller 74 of the controller 7 determines whether the next silicon concentration is different from the current silicon concentration by a preset range or more (S22). If the next silicon concentration is included in the preset concentration range (does not fall out of the preset concentration range) (S22—NO), the integral control is performed. That is, the calculator 73 of the controller 7 calculates the feed amount and the drain amount of the processing liquid based on the integration (S23), and the processing liquid controller 74 of the controller 7 performs the control of the flow rate based on the calculation result of the calculator 73 (S24). Meanwhile, if the next silicon concentration is not included in the preset concentration range (falls out of the preset concentration range) (S22—YES), it is determined that the preset concentration range has been changed, that is, the setting of the silicon concentration has been changed, and the control regarding the change of the concentration is performed.

As described above, the calculator 73 of the controller 7 creates the set curve C for the variation of the silicon concentration based on the information upon the changed concentration, and calculates the feed amount and the drain amount of the processing liquid such that the concentration varies according to this set curve C (S25). Then, the processing liquid controller 74 of the controller 7 controls the flow rate based on the calculation result of the calculator 73 (S26). As stated above, the controller 7 performs the integral control (S23, S24) or the prediction control (S25, S26) based on the result of the comparison between the current silicon concentration and the next silicon concentration in the process S22.

Moreover, the calculator 73 of the controller 7 checks whether the measurement result of the silicon concentration from the silicon concentration meter 53 is received (S27). If the measurement result from the silicon concentration meter 53 is not received (S27—NO), the same control is repeated when predicting/calculating the next silicon concentration (silicon concentration after 1 minute).

Meanwhile, if the measurement result from the silicon concentration meter 53 is received (S27—YES: concentration measurement process), the silicon concentration obtained from the received measurement result and the silicon concentration calculated by the calculator 73 of the controller 7 are compared, and it is determined whether the correction of the feed amount and the drain amount of the processing liquid is needed (S28). If the correction is required (S28—YES), the calculator 73 calculates the feed amount and the drain amount which are corrected, and the flow rates (the feed amount and the drain amount) are corrected based on this calculation result (S29). Further, if it is determined that the correction is not required (S28—NO), the correction by the calculator 73 is not performed.

The series of processes shown in FIG. 6 are repeated until the measurement result of the silicon concentration from the silicon concentration meter 53 is received (S27—YES). If, however, the set curve C up to the preset concentration is created and the feed amount and the drain amount of the processing liquid are calculated such that the concentration is changed according to the set curve C, it may be assumed that the calculation need not be performed until the correction based on the measurement result from the silicon concentration meter 53 is carried out. In such a case, the calculation of the flow rate (S25) may be omitted.

After the measurement result of the silicon concentration from the silicon concentration meter 53 is received (S27—YES) and the correction (S29) is conducted when necessary, the corrections based on the other parameters are conducted, referring back to FIG. 5. That is, after the correction for the temperature of the phosphoric acid of the processing liquid in the processing liquid storage 38 (S10) and the correction for the feed amount of the pure water supplied from the water supply 44 (S11) are conducted, the controller 7 may control the feed amount and the drain amount of the processing liquid by controlling the processing liquid supply 39 and the processing liquid drain device 41 (S12). Further, in the process S12 of controlling the feed amount and the drain amount of the processing liquid, the control for adjusting the various parameters regarding the processing liquid in the processing liquid storage 38 (for example, nitrogen bubbling in the processing tub 34) may be performed at the same time.

The processes from the control of the silicon concentration (S09) to the control of the other parameters (S12) are repeated until the liquid processing on the substrate 8 is ended. That is, the controller 7 determines whether to end the processing (S13). If it is determined that the liquid processing is not to be ended yet (S13—NO), the series of processes S09 to S12 are repeated. Meanwhile, if it is determined that the liquid processing on the substrate 8 is to be ended (S13—YES), the substrate 8 is carried out (S14), and the liquid processing upon the corresponding substrate 8 is ended.

[Effects]

In the above-described exemplary embodiment, when the silicon concentration of the processing liquid stored in the processing tub 34 of the substrate liquid processing apparatus A1 needs to be changed, the feed amount and the drain amount of the processing liquid are calculated, in response to the instruction to change the silicon concentration of the processing liquid stored in the processing tub 34, based on the information upon the current silicon concentration, the information upon the variation (increment) of the silicon concentration of the processing liquid in the processing tub 34 per unit time and the information upon the silicon concentration after being changed in response to the instruction. Then, based on the calculation result, the processing liquid supply 39 and the processing liquid drain device 41 are controlled. Therefore, when it is required to change the silicon concentration, the change of the silicon concentration can be carried out rapidly and accurately. In comparison with a case where the concentration change is performed through the measurement of the silicon concentration with the silicon concentration meter, the control responsiveness is improved, so that the concentration change can be performed rapidly. Furthermore, since the prediction of the concentration is performed in consideration of the variation of the silicon concentration of the processing liquid per unit time, the silicon concentration of the processing liquid in the processing tub can be predicted with high accuracy to calculate the feed amount and the drain amount of the processing liquid. Since the control is performed based on this accurate calculation result, the accuracy of the concentration change is improved.

In the above-described exemplary embodiment, since the silicon concentration of the processing liquid stored in the processing tub 34 can be measured by the silicon concentration meter 53 in the substrate liquid processing apparatus A1, the controller 7 can control the processing liquid supply 39 and the processing liquid drain device 41 based on the measurement result of the silicon concentration, for example. To elaborate, in the above-described exemplary embodiment, the calculation results of the feed amount and the drain amount of the processing liquid are corrected based on the silicon concentration measured by the silicon concentration meter 53, and the processing liquid supply 39 and the processing liquid drain device 41 are controlled based on the calculation results obtained after the correction is made. With this configuration, the change of the silicon concentration of the processing liquid in the processing tub 34 can be performed with higher accuracy.

In the above-described exemplary embodiment, the controller 7 of the substrate liquid processing apparatus A1 controls the processing liquid supply 39 and the processing liquid drain device 41 based on the measurement result of the silicon concentration meter 53 such that the silicon concentration of the processing liquid stored in the processing tub 34 is maintained constant in the period during which the concentration of the certain component is maintained constant (that is, in the period during which the concentration is not changed). As a result, the concentration of the certain component of the processing liquid stored in the processing tub can be controlled to be constant based on the measurement result of the silicon concentration meter 53 even in the period during which the silicon concentration of the processing liquid is maintained constant. Therefore, the management of the concentration can be performed accurately. Furthermore, as stated in the exemplary embodiment, the control combined with the calculation for the prediction of the concentration every preset time (every single minute) may be performed. In such a case, the management of the silicon concentration can be carried out with higher accuracy.

In the above-described exemplary embodiment, the processing liquid supply 39 includes the water supply 44. Thus, the silicon concentration and the liquid surface of the processing liquid supplied from the processing liquid supply can be adjusted by using the water supply 44. Therefore, the adjustment of the silicon concentration in the processing tub 34 can be performed more precisely.

In the above-described exemplary embodiment, the increment of the silicon concentration per unit time in the processing liquid stored in the processing tub 34 may be calculated by the controller 7 in the period during which the concentration of the certain component of the processing liquid is maintained constant. In such a configuration, the information upon the increment of the concentration of the certain component in the actual liquid processing can be obtained, as compared to a case where the increment of the concentration is calculated previously. Therefore, the feed amount and the drain amount of the processing liquid into/from the processing tub 34 can be calculated based on this information upon the increment of the concentration of the certain component. Thus, the change of the silicon concentration of the processing liquid in the processing tub 34 can be performed with higher accuracy.

Modification Examples

As discussed above, the above-described exemplary embodiment is not meant to be anyway limiting. The exemplary embodiment can be changed and modified in various ways without departing from the scope of the present disclosure.

For example, the above exemplary embodiment has been described for the case where the certain component of the processing liquid is silicon and the silicon concentration of the processing liquid is controlled. However, the certain component is not limited to the silicon.

Further, the configuration and the layout of the processing liquid supply 39 and the processing liquid drain device 41 may be modified appropriately. Besides, the number of the processing liquid supply 39 and the processing liquid drain device 41 may also be appropriately changed.

Moreover, the placement of the silicon concentration meter 53 serving as the concentration measuring device may also be appropriately modified. In the above-described exemplary embodiment, the silicon concentration meter 53 is provided at the circulation path 49 of the processing liquid circulator 40. However, the location of the silicon concentration meter 53 is not particularly limited as long as it is capable of measuring the concentration of the processing liquid in the processing tub 34.

EXAMPLES

Example 1

A substrate liquid processing apparatus includes a processing tub configured to store a processing liquid therein; a processing liquid supply configured to supply the processing liquid into the processing tub; a processing liquid drain device configured to drain the processing liquid from the processing tub; and a controller configured to control the processing liquid supply and the processing liquid drain device. The controller calculates, in response to an instruction to change a concentration of a preset component of the processing liquid stored in the processing tub, a drain amount of the processing liquid from the processing tub and a feed amount of the processing liquid into the processing tub based on information upon a current concentration of the preset component, information upon a concentration increment of the preset component of the processing liquid in the processing tub per unit time and information upon the concentration of the preset component after being changed in response to the instruction, and controls the processing liquid supply and the processing liquid drain device based on a calculation result. In this substrate liquid processing apparatus, in response to the instruction to change the concentration of the preset component in the processing liquid stored in the processing tub, the controller calculates the drain amount of the processing liquid from the processing tub and the feed amount of the processing liquid into the processing tub based on the information upon the current concentration of the preset component, the information upon the increment of the concentration of the preset component in the processing liquid stored in the processing tub per unit time and the information upon the concentration of the preset component after being changed in response to the instruction. Then, based on this calculation result, the controller controls the processing liquid supply and the processing liquid drain device. By adopting this configuration, in response to the instruction regarding the concentration change, the change of the concentration of the preset component of the processing liquid in the processing tub can be carried out accurately.

Example 2

The substrate liquid processing apparatus described in Example 1 may further include a concentration measuring device configured to measure the concentration of the preset component of the processing liquid stored in the processing tub at a regular time interval. In this configuration, since the concentration of the preset component in the processing liquid stored in the processing tub can be checked by the concentration measuring device, the controller can control the processing liquid supply and the processing liquid drain device based on the measurement result of the concentration of the preset component, for example. Thus, the change of the concentration of the preset component of the processing liquid in the processing tub can be carried out with higher accuracy.

Example 3

In the substrate liquid processing apparatus described in Example 2, the controller may correct the calculation result based on a measurement result of the concentration measuring device, and may control the processing liquid supply and the processing liquid drain device based on the corrected calculation result. In this configuration, the calculation result can be corrected based on the concentration measured by the concentration measuring device, and the processing liquid supply and the processing liquid drain device can be controlled based on the calculation result which is obtained after the correction. Therefore, the change of the concentration of the preset component of the processing liquid in the processing tub can be performed with higher accuracy.

Example 4

In the substrate liquid processing apparatus described in Example 2 or Example 3, in a period during which the concentration of the preset component of the processing liquid is maintained constant, the controller may control the processing liquid supply and the processing liquid drain device based on the measurement result of the concentration measuring device such that the concentration of the preset component of the processing liquid stored in the processing tub is maintained constant. In this configuration, even in the period during which the concentration of the preset component in the processing liquid is maintained constant, the concentration of the preset component of the processing liquid in the processing tub can be controlled to be maintained constant based on the measurement result of the concentration measuring device. Thus, even in the period during which the concentration of the preset component in the processing liquid is maintained constant, the management of the concentration can be performed accurately.

Example 5

In the substrate liquid processing apparatus described in Example 1 to Example 4, the processing liquid supply may comprise a pure water supply. In this configuration, since the adjustment of the concentration of the preset component in the processing liquid supplied from the processing liquid supply or the like is enabled by using the pure water supply, the adjustment of the concentration of the preset component of the processing liquid in the processing tub can be carried out more precisely.

Example 6

In the substrate liquid processing apparatus described in Example 1 to Example 5, the concentration increment of the preset component of the processing liquid in the processing tub per unit time may be calculated by the controller in the period during which the concentration of the preset component in the processing liquid is maintained constant. In this configuration, the increment of the concentration of the preset component in the processing liquid per unit time is calculated by the controller in the period during which the concentration of the preset component of the processing liquid is maintained constant. Therefore, as compared to a case where the increment of the concentration is previously calculated, the information upon the increment of the concentration of the preset component in the actual liquid processing can be obtained. Thus, based on this obtained information, the drain amount of the processing liquid from the processing tub and the feed amount of the processing liquid into the processing tub can be calculated. Thus, the change of the concentration of the preset component of the processing liquid in the processing tub can be carried out with higher accuracy.

Example 7

A substrate liquid processing method includes supplying a processing liquid from a processing liquid supply into a processing tub configured to store the processing liquid therein; draining the processing liquid from the processing tub by a processing liquid drain device; and controlling the processing liquid supply and the processing liquid drain device. In the controlling of the processing liquid supply and the processing liquid drain device, in response to an instruction to change a concentration of a preset component of the processing liquid stored in the processing tub, a drain amount of the processing liquid from the processing tub and a feed amount of the processing liquid into the processing tub are calculated based on information upon a current concentration of the preset component, information upon a concentration increment of the preset component of the processing liquid in the processing tub per unit time and information upon the concentration of the preset component after being changed in response to the instruction, and a control over the processing liquid supply in the supplying of the processing liquid and a control over the processing liquid drain device in the draining of the processing liquid are performed based on a calculation result. In this case, the same effect as obtained in Example 1 can be achieved.

Example 8

The substrate liquid processing method described in Example 7 may further include measuring the concentration of the preset component of the processing liquid stored in the processing tub at a regular time interval. In this case, the same effect as obtained in Example 2 can be achieved.

Example 9

In the substrate liquid processing method described in Example 8, in the controlling of the processing liquid supply and the processing liquid drain device, the calculation result may be corrected based on a measurement result in the measuring of the concentration of the preset component, and the control over the processing liquid supply in the supplying of the processing liquid and the control over the processing liquid drain device in the draining of the processing liquid may be performed based on the corrected calculation result. In this case, the same effect as obtained in Example 3 can be achieved.

Example 10

There is provided a computer-readable recording medium having stored thereon computer-executable instructions that, in response to execution, cause an apparatus to perform a substrate liquid processing method as described in Example 7. In this case, the same effects as obtained in the above-described substrate liquid processing method can be achieved. In the present exemplary embodiment, the computer-readable recording medium includes: a non-transitory computer recording medium (for example, various kinds of main memory devices or auxiliary memory devices); and a transitory computer recording medium (for example, a data signal which can be provided through a network).

According to the substrate liquid processing apparatus of the exemplary embodiment, it is possible to change the concentration of the certain component within the processing liquid with high accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate liquid processing apparatus, comprising:
a processing tub configured to store a processing liquid therein;
a processing liquid supply including a flow rate controller and configured to supply the processing liquid into the processing tub;
a processing liquid drain device including a valve configured to drain the processing liquid from the processing tub;
a controller configured to control the flow rate controller of the processing liquid supply and the valve of the processing liquid drain device; and
a concentration measuring device configured to measure a concentration of a preset component of the processing liquid stored in the processing tub at a regular time interval,
wherein the controller is further configured to perform:
controlling the processing liquid supply and the processing liquid drain device such that a preset component of the processing liquid stored in the processing tub is maintained in a first concentration,
receiving an instruction to change a target concentration of the preset component of the processing liquid stored in the processing tub from the first concentration to a second concentration different from the first concentration,
setting a required time to change the concentration of the preset component of the processing liquid stored in the processing tub from the first concentration to the second concentration,
predicting a change of the concentration of the preset component of the processing liquid stored in the processing tub during the required time,
calculating, in response to the instruction, a drain amount per unit time of the processing liquid from the processing tub and a feed amount per unit time of the processing liquid into the processing tub based on a result of the predicting, information upon a current concentration of the preset component, information upon a concentration increment of the preset component of the processing liquid in the processing tub per unit time and information upon the concentration of the preset component after being changed in response to the instruction, and
controlling the feed amount per unit time of the processing liquid into the processing tub by controlling an opening/closing operation of the flow rate controller of the processing liquid supply and the drain amount per unit time of the processing liquid from the processing tub by adjusting the valve of the processing liquid drain device based on a calculation result, wherein the concentration increment of the preset component of the processing liquid in the processing tub per unit time is calculated by the controller in a period during which the controller is configured to control the processing liquid supply and the processing liquid drain device based on a measurement result of the concentration measuring device such that the concentration of the preset component in the processing liquid is maintained constant.

2. The substrate liquid processing apparatus of claim 1, wherein the controller is further configured to perform:

correcting the calculation result based on the measurement result of the concentration measuring device, and controlling the processing liquid supply and the processing liquid drain device based on the corrected calculation result.

3. The substrate liquid processing apparatus of claim 2, wherein the processing liquid supply comprises a pure water supply.

4. The substrate liquid processing apparatus of claim 1, wherein the processing liquid supply comprises a pure water supply.

* * * * *